（12）United States Patent
Dimaano, Jr. et al.

(10) Patent No.: US 10,573,590 B2
(45) Date of Patent: Feb. 25, 2020

(54) MULTI-LAYER LEADLESS SEMICONDUCTOR PACKAGE AND METHOD OF MANUFACTURING THE SAME

(71) Applicant: UTAC Headquarters Pte. Ltd., Singapore (SG)

(72) Inventors: Antonio Bambalan Dimaano, Jr., Singapore (SG); Roel Adeva Robles, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 48 days.

(21) Appl. No.: 15/788,753

(22) Filed: Oct. 19, 2017

(65) Prior Publication Data

US 2018/0114749 A1  Apr. 26, 2018

Related U.S. Application Data

(60) Provisional application No. 62/410,838, filed on Oct. 20, 2016.

(51) Int. Cl.
*H01L 23/498* (2006.01)
*H01L 21/683* (2006.01)
(Continued)

(52) U.S. Cl.
CPC .... *H01L 23/49838* (2013.01); *H01L 21/4853* (2013.01); *H01L 21/4857* (2013.01); *H01L 21/4867* (2013.01); *H01L 21/565* (2013.01); *H01L 21/6835* (2013.01); *H01L 23/3114* (2013.01); *H01L 23/49822* (2013.01); *H01L 23/3128* (2013.01); *H01L 23/49816* (2013.01); *H01L 24/32* (2013.01); *H01L 24/48* (2013.01); *H01L 24/83* (2013.01); *H01L 24/85* (2013.01); *H01L 2221/68345* (2013.01); *H01L 2221/68359* (2013.01); *H01L 2221/68381* (2013.01); *H01L 2224/2919* (2013.01); (Continued)

(58) Field of Classification Search
None
See application file for complete search history.

(56) References Cited

U.S. PATENT DOCUMENTS 9,741,664 B2 * 8/2017 Chiu .................. H01L 24/23
2011/0095403 A1 * 4/2011 Lee .................... H01L 21/4857
257/660

(Continued)

FOREIGN PATENT DOCUMENTS

KR  10-2017-082359  *  1/2016

*Primary Examiner* — Nishath Yasmeen
(74) *Attorney, Agent, or Firm* — Horizon IP Pte Ltd.

(57) ABSTRACT

Device and method of forming the device are disclosed. A device includes a buildup package substrate with top and bottom surfaces and a plurality of interlevel dielectric (ILD) layers with interconnect structures printed layer by layer and includes a die region and a non-die region on the top surface. A semiconductor die is disposed in the die and non-die regions of the package substrate and is electrically connected to the plurality of interconnect structures via a plurality of wire bonds. A plurality of conductive elements are disposed on the bottom surface of the package substrate and a dielectric layer encapsulates the semiconductor die, the wire bonds and the top surface of the buildup package substrate.

11 Claims, 11 Drawing Sheets

(51) Int. Cl.
*H01L 21/48* (2006.01)
*H01L 21/56* (2006.01)
*H01L 23/31* (2006.01)
*H01L 23/00* (2006.01)

(52) U.S. Cl.
CPC ............... *H01L 2224/32058* (2013.01); *H01L 2224/32106* (2013.01); *H01L 2224/32225* (2013.01); *H01L 2224/45139* (2013.01); *H01L 2224/45144* (2013.01); *H01L 2224/45147* (2013.01); *H01L 2224/48227* (2013.01); *H01L 2224/48229* (2013.01); *H01L 2224/73265* (2013.01); *H01L 2224/8385* (2013.01); *H01L 2224/83192* (2013.01); *H01L 2224/83385* (2013.01); *H01L 2224/83801* (2013.01); *H01L 2924/15311* (2013.01)

(56) References Cited

U.S. PATENT DOCUMENTS

| | | | |
|---|---|---|---|
| 2016/0300817 A1* | 10/2016 | Do | H01L 25/50 |
| 2017/0194239 A1* | 7/2017 | Ryu | H01L 23/49838 |
| 2018/0294233 A1* | 10/2018 | Yoon | H01L 23/49838 |

* cited by examiner

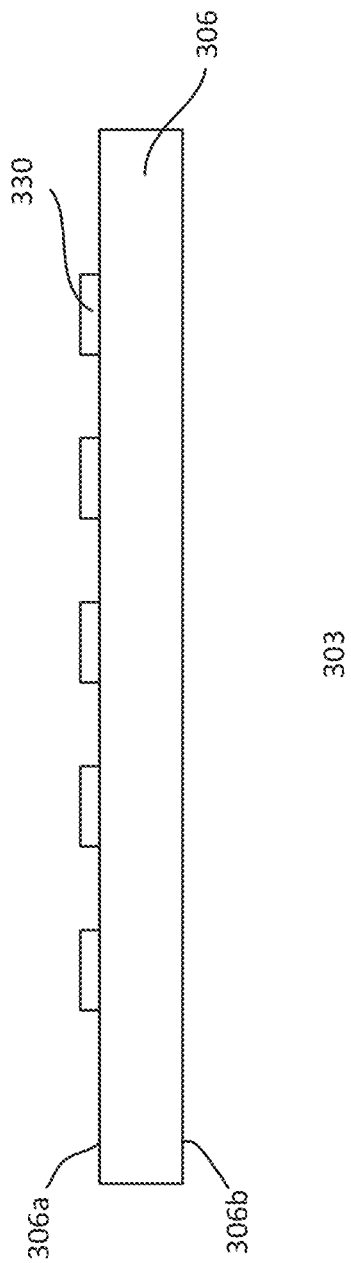

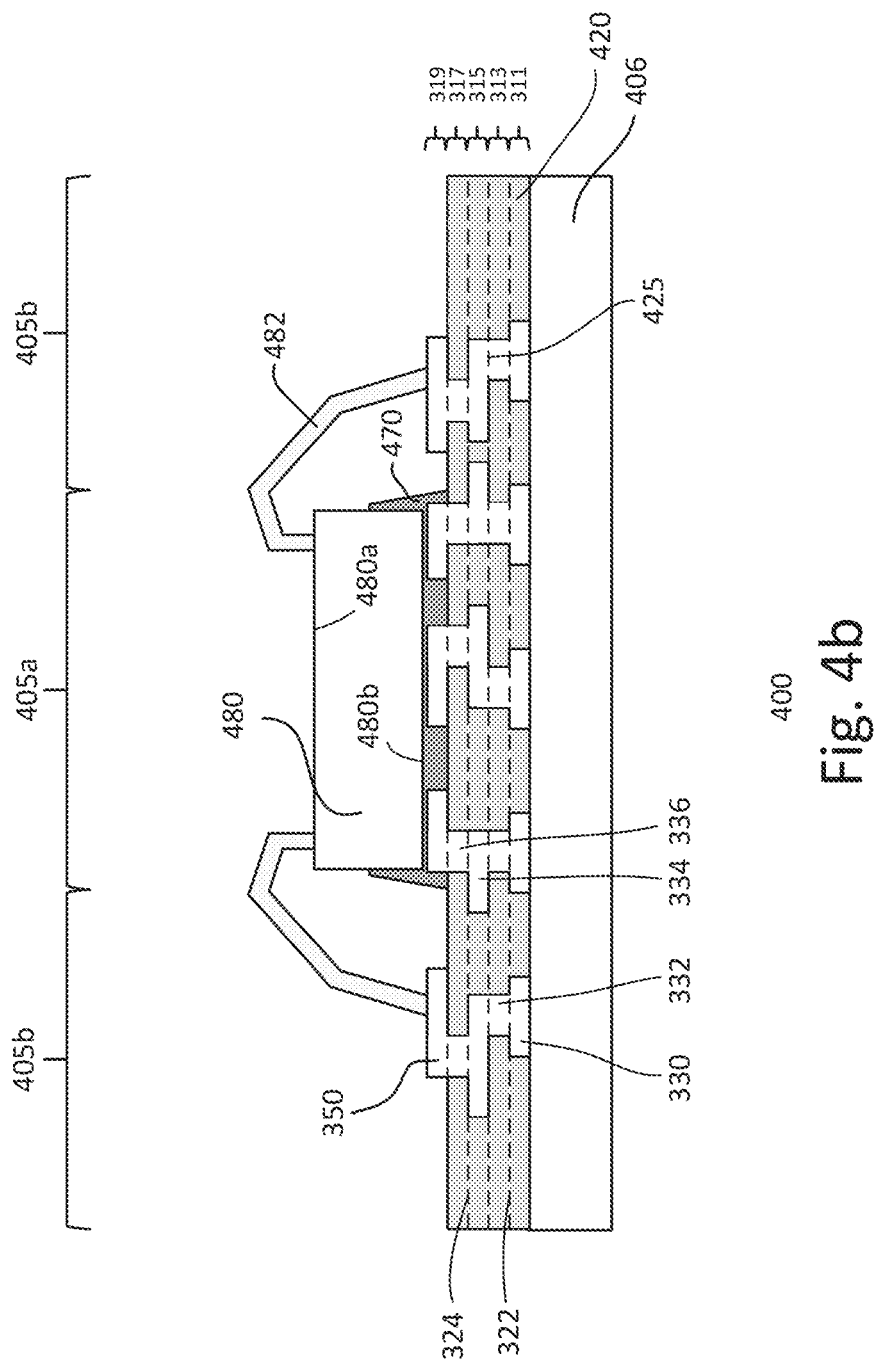

US 10,573,590 B2

MULTI-LAYER LEADLESS SEMICONDUCTOR PACKAGE AND METHOD OF MANUFACTURING THE SAME

BACKGROUND

Miniaturization of consumer electronic and communication products such as personal computers, mobile phones and wearable smart devices are driving demand for semiconductor packages with smaller footprint. However, as integrated circuit (IC) package technology advances, an increasing number of input/output (I/O) connections is required on the semiconductor package to integrate complex circuit designs and provide better package performance.

Grid array packages and leadframe-based packages, such as ball grid array (BGA) packages and quad flat no-lead (QFN) packages, are popular packaging solutions for reducing package size and increasing I/O connections. However, existing grid array and leadframe-based packages suffer from various design and production limitations. For example, fabrication of BGA packages is relatively costly and vulnerable to moisture-related manufacturing defects. As for QFN packages, the need to maintain a minimum pitch between I/O connections in QFN packages impedes efforts to further reduce package size.

From the foregoing discussion, there is a desire to provide an improved semiconductor package having higher I/O counts and a smaller footprint. It is also desirable to provide a cost-efficient method of producing such a semiconductor package.

SUMMARY

Embodiments described herein generally relate to semiconductor packages and methods for forming a semiconductor package. In one embodiment, a method of forming a device is disclosed. The method includes forming a buildup package substrate with a top surface and a bottom surface, disposing die and non-die regions on the top surface, and printing at least an interlevel dielectric (ILD) layer with interconnect structures. The method further includes disposing bond pads on the top surface and disposing a semiconductor die in the die region. The method continues by electrically connecting the semiconductor die to the interconnect structures via a plurality of wire bonds and disposing a plurality of conductive elements in the non-die region and the bottom surface of the package substrate. The method goes on to complete forming of the device by encapsulating the semiconductor die, the wire bonds and the top surface of the package substrate with a dielectric layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3a-3e show cross-sectional views of an embodiment of a process for forming a package substrate; and FIGS. 4a-4d show cross-sectional views of an embodiment of a process for forming a semiconductor package.

DESCRIPTION

Embodiments relate to semiconductor packages and methods for forming a semiconductor package. The packages are used to package one or more semiconductor dies or chips. For the case of more than one die, the dies may be arranged in a planar arrangement, vertical arrangement, or a combination thereof. The dies, for example, may include memory devices, logic devices such as mixed signal logic devices, communication devices, RF devices, optoelectronic devices, digital signal processors (DSPs), microcontrollers, system-on-chips (SOCs) as well as other types of devices or a combination thereof. Such packages may be incorporated into electronic products or equipment, such as phones, computers as well as mobile and mobile smart products. Incorporating the packages into other types of products may also be useful.

Figure 1:
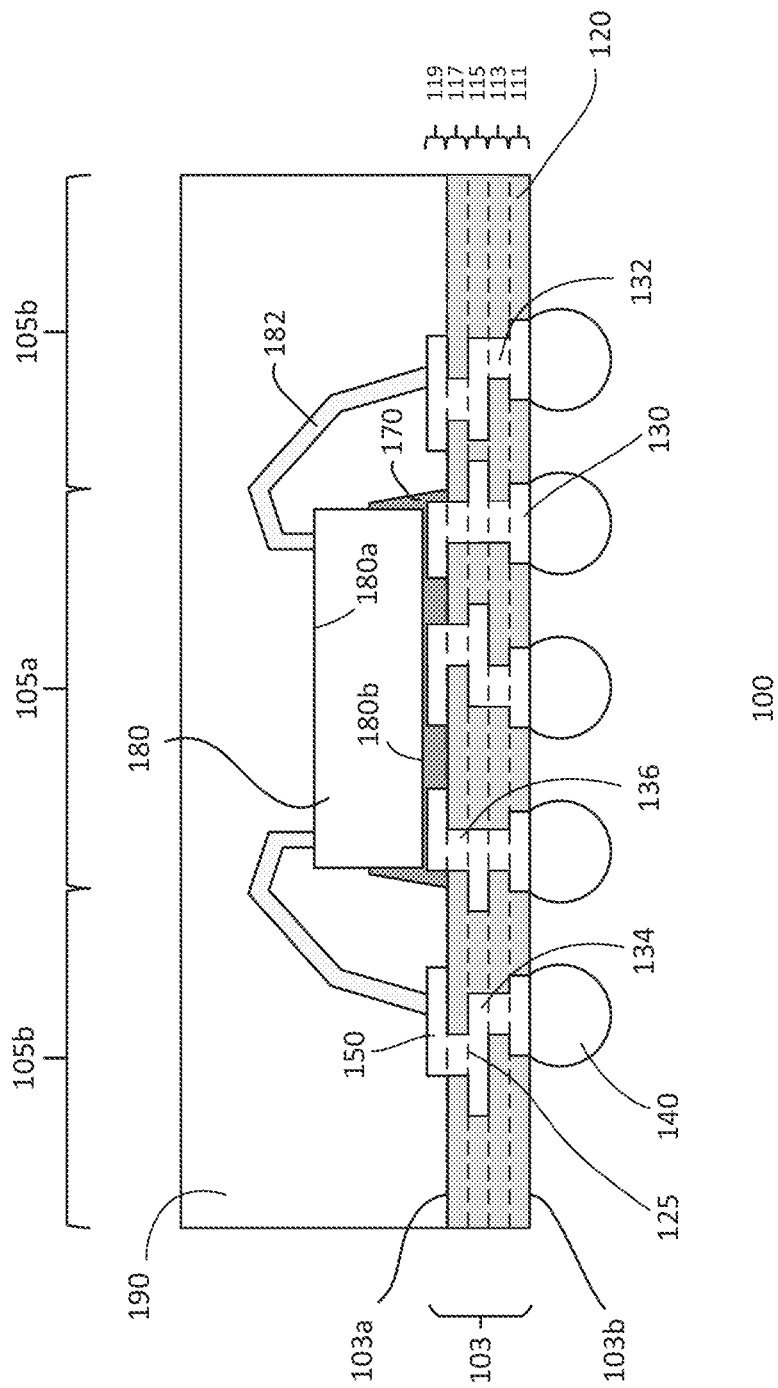
FIG. 1 shows a cross-sectional view of an embodiment of a semiconductor package.

FIG. 1 shows a simplified cross-sectional view of an embodiment of a semiconductor package 100. The semiconductor package includes a package substrate 103. The package substrate includes first and second major surfaces. The first major surface 103a may be referred to as the top substrate surface and the second major surface 103b may be referred to as the bottom substrate surface. In one embodiment, the top surface of the package substrate includes first and second regions. For example, the first region 105a corresponds to a die or chip region of the top substrate surface on which a die 180 is mounted and the second region 105b corresponds to a non-die region surrounding the die region. The die, for example, may be concentrically disposed within the die region on the package substrate. Other configurations and locations of die and non-die regions may also be useful.

The package substrate may include a plurality of interconnect structures 125 disposed in the die and non-die regions of the package substrate, as will be described in more detail later. In one embodiment, the interconnect structures electrically couple the die disposed on the first major surface of the package substrate to package contacts 140 disposed on the second major surface of the package substrate. For example, the die may be mounted on die attached layer 170 disposed in the die region on the second major surface of the package substrate. Alternatively, the die may also be mounted on die paddle or directly on the contact traces on the second major surface of the package substrate. Providing other ways for the mounting of the die onto the package substrate may also be useful. The package contacts, for example, provide the semiconductor package substrate and the die with electrical connection points to the outside through the interconnect structures disposed in the package substrate.

In one embodiment, the package substrate includes a conductive base carrier suitable for forming a leadframe based leadless package, such as a quad flat no-lead (QFN) package. The base carrier is, for example, a leadframe formed from copper (Cu) material or an alloy thereof. Other suitable conductive materials, such as aluminum (Al), nickel (Ni), silver (Ag), gold (Au), solder material, or the alloys of these materials, or a combination thereof may also be used to form the leadframe. In one embodiment, the leadframe may define an uppermost interconnect layer of the package substrate. The interconnect structures of the package substrate allow routing of signals through the semiconductor package. In one embodiment, the interconnect structures include a plurality of interconnect levels corresponding to a plurality of via levels and line levels of the package substrate. For example, a via level accommodates via contacts while a line level accommodates conductive traces and/or contact terminals of the package substrate. In one embodiment, the package substrate includes n number of line levels and m number of via levels, where n is any number within the design requirement for the package substrate and has a minimum value of 1 and m is a value equal to (n−1). For example, when n=1, there is no via level and the single line level has conductive tracers acting as contacts electrically coupling the die to the package contacts and can be printed or defined by the leadframe.

In one embodiment, bond pads 150 are provided in the uppermost interconnect level 119 in the die region on the first major surface of the package substrate. Alternatively, providing bond pads in the uppermost interconnect level in the non-die regions, or both die and non-die regions, are also useful. The bond pads, for example, serve as top contact terminals for coupling a semiconductor die or chip to the interconnect structures of the package. For example, the bond pads on the first major surface serve to couple the die to the via contacts. Alternatively, when there is no via contacts, the bond pads also serves as terminal pads of the package substrate. Providing other methods to establish a connection between the die and the interconnect structures may also be useful. In one embodiment, the conductive traces and via contacts of the package substrate electrically couple the bond pads to terminal pads 130 exposed on the second major surface of the package substrate. The terminal pads of the package substrate may serve as contact terminals for coupling package contacts to the interconnect structures.

Via contacts are disposed between the different line levels to couple conductive traces or contact pads on adjacent line levels. For example, a via contact may serves to couple bond pads or conductive traces on an upper line level to conductive traces or terminal pads on a lower line level. In one embodiment, the bond pads disposed on the first major surface may define an uppermost line level 119 of the interconnect levels. For example, the uppermost line level includes bond pads. In one embodiment, second via contacts 136 are disposed directly below the bond pads in the uppermost line level to define a second via level 117 of the interconnect levels. The second via level, for example, includes second (or second level) via contacts which couple the bond pads to intermediate interconnect line level conductive traces 134 disposed in an intermediate interconnect line level 115, which is situated below the second via level. In one embodiment, first (or first level) via contacts 132 are disposed in a first via level 113 and couple the intermediate interconnect line level conductive traces to the terminal pads 130 disposed in a lowermost line level. The terminal pads 130, for example, define the lowermost line level 111 of the interconnect levels.

In one embodiment, the uppermost line level is proximate to the first major surface of the package substrate and the lowermost line level is proximate to the second major surface of the package substrate. The via contacts, conductive traces, terminal pads and bond pads form the interconnect structures of the package substrate. For example, the via contacts provide a vertical connection and the conductive traces provide a lateral connection to route electrical signals through the package. The terminal pads and bond pads, for example, serve as contact terminals of the interconnect structures. Other configuration of interconnect structures may also be useful, depending on design requirements.

It will be appreciated that the intermediate interconnect level may be configured to include a plurality of intermediate line levels and additional via levels to provide vertical connections to adjacent line levels of the plurality of intermediate line levels, depending on design requirements. For example, two or more intermediate line levels may also be provided between the uppermost and lowermost line levels to provide the package with additional interconnect line levels for routing of electrical signals. Providing a package substrate with multiple line levels allows more complex circuitry to be formed in the package substrate. Hence, this allows for higher I/O counts for the package which enhances device performance.

In one embodiment, the conductive traces and contact terminals (e.g., terminal pads and bond pads) may be formed of the same conductive material as the via contacts. For example, the conductive traces, contact terminals and via contacts include Cu material, silver (Ag) or other precious metals, or an alloy thereof. Other suitable conductive materials may also be useful. Providing interconnect structures which include different conductive materials may also be useful. For example, the via contacts may include a different conductive material from the conductive traces and contact terminals. Other configurations of conductive traces, contact pads, and via contacts may also be useful.

In one embodiment, the package substrate includes an insulator layer 120 having first and second major surfaces. The first and the second major surfaces of the insulator layer may correspond to the first and second major surfaces and of the package substrate. For example, the first major surface of the insulator layer defines the top package substrate surface and the second major surface of the insulator layer defines the bottom package substrate surface. The insulator layer is provided to prevent signal interference between adjacent interconnect structures of the package. In one embodiment, the insulator layer is disposed between and surrounds the interconnect structures positioned below the uppermost line level. For example, the insulator layer surrounds the via contacts in the first and second via levels and, the conductive traces in the intermediate interconnect line level, and the terminal pads in the lowermost interconnect line level. For example, the insulator layer provides isolation between the conductive traces, via contacts and terminal pads. In one embodiment, the insulator layer is a dielectric layer. The insulator layer, for example, includes polymer material which is not internally reinforced, such as but not limited to polyimide. Other suitable dielectric materials, such as solder mask, inorganic insulating film, epoxy resin or dielectric composites, may also be useful.

The package substrate may be a single layer substrate or a multi-layer substrate. In the case of a multi-layer substrate, the different layers can be built up from a printing process. In one embodiment, the package substrate is multi-layer buildup substrate formed from a printing process. For example, the printing process may be utilizing an ink-jet printing process by dispensing either or both conductive material and non-conductive material onto a surface that can also be the respective material itself. For example, the package substrate is formed from multiple printed layers of conductive material and dielectric material which sequentially build up the insulator layer and interconnect structures, forming the package substrate. Alternatively, the printing process may be a screen printing process which utilizes a stencil to define the patterns or traces for the layers. Other types of multi-layer buildup package substrate may also be useful. For example, the different layers may be built up from a combination of lamination and printing processes. For example, a hybrid interconnect may be formed using both lamination and printing to form alternating layers of lamination for the multi-layer substrate. Providing a multi-layer buildup package substrate utilizing printing, laminating or any other deposition techniques or a combination thereof in any layering arrangements may also be useful.

In one embodiment, package contacts are disposed on the terminal pads. The package contacts, for example, electrically couple the interconnect structures to an external device (not shown), such as a printed circuit board (PCB). The package contacts are formed of a conductive material, such as varieties of solder alloy, silver materials and varieties of silver alloy, copper paste and varieties of copper alloy. Other suitable types of conductive materials may also be used to form the package contacts. The package contacts, in one embodiment, are spherical shaped structures such as solder balls. The package contacts, for example, protrude from the second major surface of the package substrate. Providing package contacts which do not protrude from the bottom surface of the package substrate, may also be useful. Other configurations of package contacts may also be useful. For example, the package contacts may be flat shape contacts or pads having a planar bottom surface. Flat shape package contacts may be configured to include, for example, any suitable geometrical shape such as square or rectangular shape.

In one embodiment, the package contacts are positioned within a peripheral region of the second major surface of the package substrate. In another embodiment, the package contacts are positioned in full area array. For example, the package contacts are arranged in a plurality of rows and columns to provide a dense I/O (input/output) connection area on the bottom surface of the package substrate. The package contacts are, in one embodiment, arranged in a grid array pattern to form a QFN grid array type package. Arranging the package contacts in other patterns may also be useful, depending on design requirements.

In one embodiment, a die attach layer 170 is disposed on the first major surface of the package substrate in a central portion of the die region. For example, the die attach layer is concentrically disposed within the die region and surrounded by the bond pads positioned in the non-die region. Alternatively, the die attach layer may also be disposed in the non-die region. Providing the die attach layer covering the bond pads in either or both die and non-die regions may also be useful. The die attach layer serves to mount the die 180 to the package substrate. The die may be a semiconductor die or chip. The die includes first and second major surfaces 180a and 180b. The first major surface, for example, is an active surface of the die and the second major surface is an inactive surface of the die. Other designations for the surfaces of the die may also be useful. The active surface, for example, includes openings (not shown) in a final passivation layer to expose conductive die pads (not shown). The surfaces of the die pads, for example, are substantially coplanar with the first major surface of the die. Providing die pads with surfaces which are not coplanar with the first major surface of the die may also be useful. The die pads serve as contact terminals for connections to the circuitry of the die. The die pads, for example, are formed of a conductive material, such as Cu, Al, Au, Ag, Ni, solder material, or the alloys of these materials, or a combination thereof. Other types of conductive material may also be used for the die pads. The pattern of the die pads may be one or more rows disposed at the periphery of the active surface. Other die pad patterns may also be useful.

In one embodiment, the inactive surface of the die is mounted onto the die region of the package substrate with the use of the die attach layer. The die attach layer, for example, may include an adhesive material, such as adhesive paste or die attach film, such as tape. Other types of adhesive materials, such as epoxy, may also be useful. In one embodiment, wire bonds 182 are provided to couple the die pads on the active surface of the die to the bond pads on the package substrate. The wire bonds create electrical connection between the interconnect structures (e.g., bond pads and via contacts) of the package substrate and die pads on the die.

In one embodiment, an encapsulation layer (or cap) 190 is disposed on top of the package substrate, encapsulating the die and the wire bonds. As shown, the bottom surface of the cap may be formed to contact the die attach layer and insulating layer of the package substrate. The cap serves to protect the die from the environment. For example, the cap may protect the die from moisture. In one embodiment, the cap is formed of an encapsulation material. The encapsulation material, for example, may include molding epoxy resin material. Other suitable types of encapsulation materials may also be useful.

Figure 2:
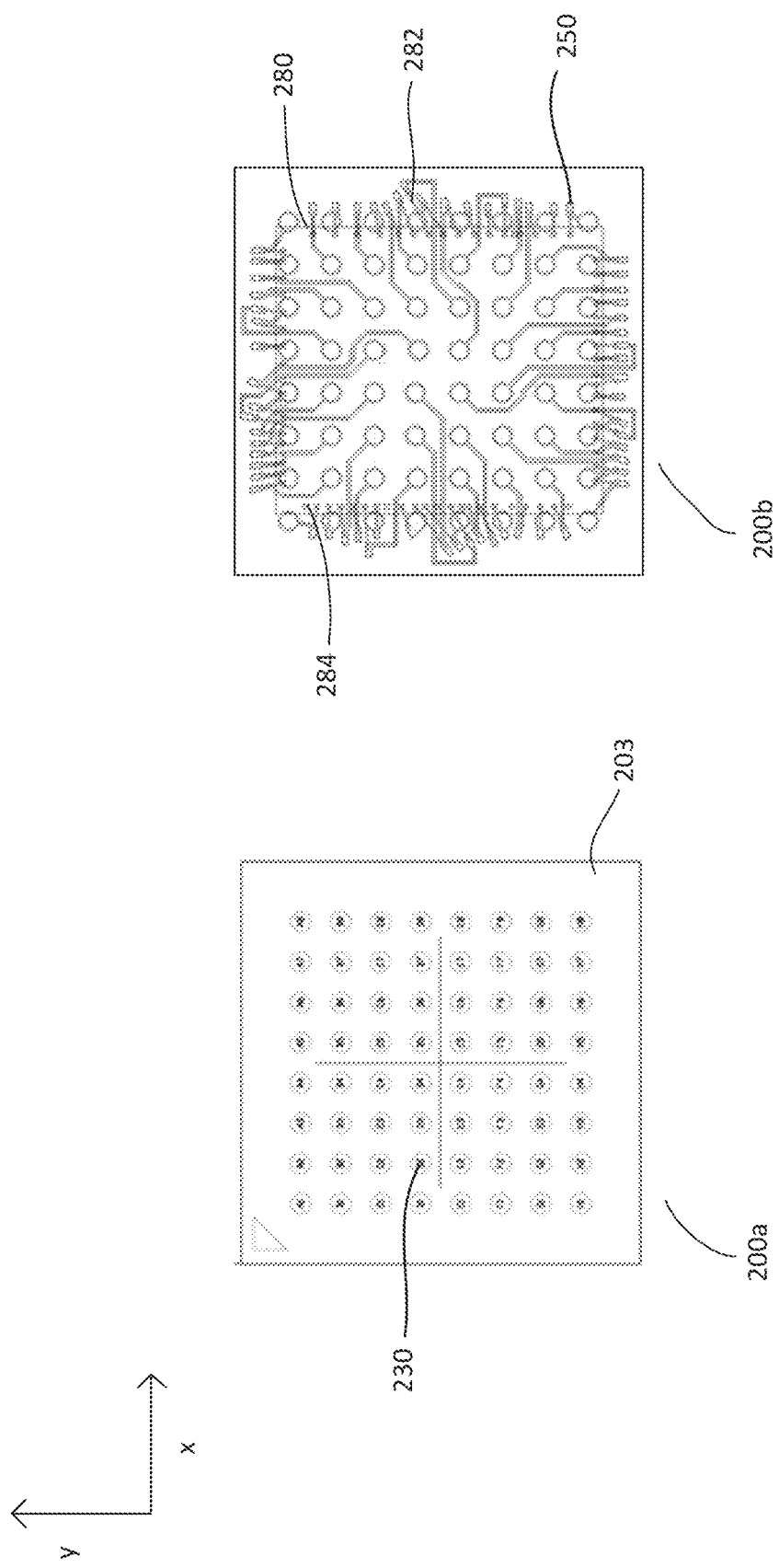
FIG. 2 shows simplified plan view of the bottom and top of an embodiment of a semiconductor package.

FIG. 2 shows simplified plan view of the bottom and top surfaces 200a and 200b of an embodiment of a semiconductor package. The semiconductor package is, for example, same as that described in FIG. 1. For example, the semiconductor package is a QFN grid array package. In the interest of brevity, common elements and features having the same reference numerals may not be described or described in detail.

In one embodiment, the QFN grid array package includes terminal pads 230 positioned about the second major surface of the package substrate 203 in a grid array pattern. The terminal pads are, for example, solder lands disposed on a bottom surface (or underside) of the package substrate. The terminal pads may serve to electrically connect the QFN grid array package to external devices such as a PCB. The grid array pattern of the terminal pads may be configured to include various geometrical placements or patterns. In one embodiment, the grid array pattern may be configured with a specified number of columns and/or rows. For example, the terminal pads of the package substrate may be aligned into multiple rows and columns around a peripheral region of the bottom substrate surface. For example, the terminal pads are arranged in rows along a first direction (or x direction) and columns along a second direction (or y direction) along the peripheral region. In one embodiment, die paddle (not shown) are positioned concentrically in the device region of the package substrate. Providing other locations for the die paddle or no die paddle may also be useful. For example, when die paddle is not used, the bond pads will be disposed below the die. Providing a grid array pattern defined by other number of rows and columns of terminal pads may also be useful depending on design requirements. Other configurations for the placement of the terminal pads may also be useful. For example, the grid array pattern of the terminal pads may also be configured to include patterns that do not align into columns and/or rows. Although, square shaped terminal pads are illustrated, it is appreciated that the terminal pads may be provided in other suitable geometrical shapes such as rectangular shape or circular shape.

In one embodiment, the QFN grid array package includes a die 280 disposed on the first major surface of the package substrate in the die region. The first major surface of the die, for example, includes openings (not shown) in a final passivation layer to expose conductive die pads 284. The die pads serve as contact terminals for connections to the circuitry of the die. The pattern of the die pads may be one or more rows disposed at the periphery of the active surface. Other die pad patterns may also be useful. In one embodiment, wire bonds 282 are provided to couple the die pads on the active surface of the die to the bond pads 250 on the first major surface of the package substrate. The wire bonds create electrical connection between the interconnect structures (e.g., conductive traces and via contacts) of the package substrate and die pads on the die.

FIGS. 3a-3e show cross-sectional views of an embodiment of a process for forming a package substrate 303. The package substrate is, for example, same as that described in FIGS. 1 and 2. In the interest of brevity, common elements and features having the same reference numerals may not be described or described in detail.

Referring to FIG. 3a, a base carrier 306 is provided. The base carrier, in one embodiment, is a conductive carrier. For example, the base carrier includes a carrier material such as stainless steel, Cu, Ag, Au, Ni, palladium (Pd) or alloys thereof. Other suitable conductive materials for the base carrier may also be useful. In one embodiment, the base carrier includes a first major surface or top surface 306a and second major surface or bottom surface 306b. The base carrier acts as a conductive structure, providing a platform on its top surface for the building up of the package substrates and attachment of semiconductor die.

In one embodiment, a first layer of conductive material 330 is printed onto the top surface of the base carrier. For example, the first layer of conductive material is printed or dispensed according to design requirements and patterns. Other deposition techniques for the layer of conductive material may also be useful. The conductive material, in one embodiment, may be Cu, Au, Ag, solder material, alloys or a combination thereof. Providing any other conductive materials may also be useful. The first layer of conductive material, in one embodiment, may be the terminal pads as defined in FIG. 1. In one embodiment, the printed first layer has a minimum exemplary thickness of 1 µm. This is applicable for all other preceding printed conductive and dielectric layers by the ink-jet printing process. Providing other thicknesses for the printed conductive and dielectric layers may also be useful.

Figure 3B:
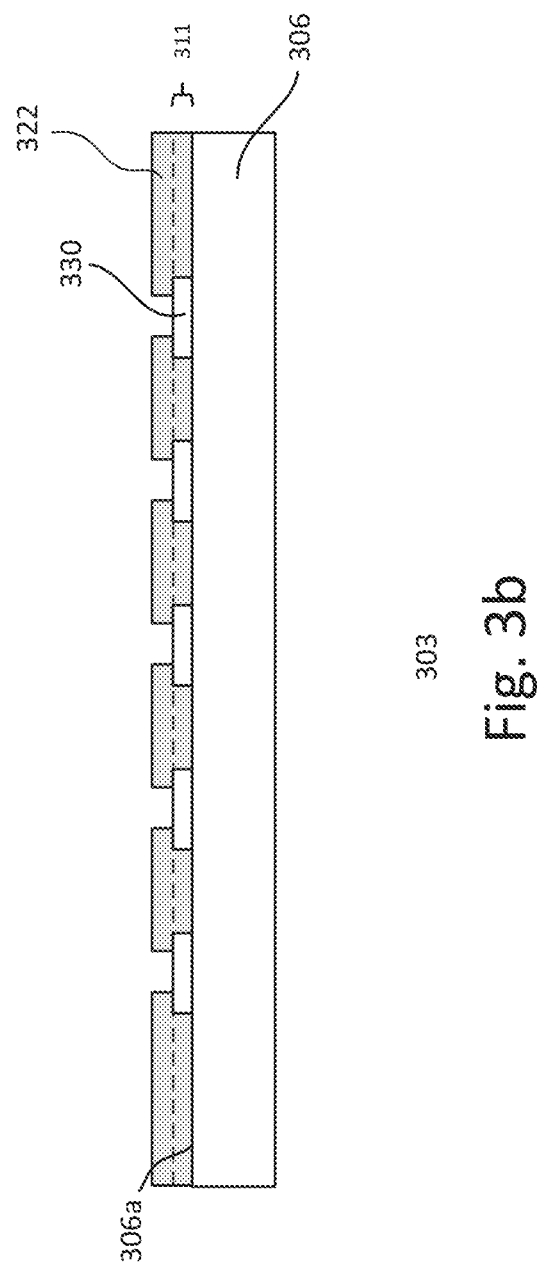

The process of building up the package substrate continues in FIG. 3b as shown. In one embodiment, a first layer of insulating material 322 is printed onto the top surface of the base carrier and over portions of the first conductive material. For example, the first layer of insulating material is also printed or dispensed according to design requirements and patterns. Other deposition techniques for the layer of insulating material may also be useful.

As shown, the disposal or printing of the first layer of insulating material completely covers all exposed top surfaces of the base carrier, filling the gaps in-between and surrounding the first layer of conductive material or terminal pads. This provide isolation and serves to prevent signal interference between adjacent terminal pads of the interconnect structures. Further, the disposal or printing of the first layer of insulating material also covers a top portion of the first layer of conductive material or terminal pads, leaving the remaining top portion exposed for building of the via connections with next layer of conductive material to form the interconnect structures. In addition, a lowermost line level 311 is also formed.

The first layer of insulating material may include dielectric materials. In one embodiment, the first layer of insulating material is a dielectric layer. The first layer of insulating material, for example, includes polymer materials which are not internally reinforced, such as but not limited to polyimide. Other suitable dielectric materials, such as solder mask, inorganic insulating film, epoxy resin or dielectric composites, may also be useful.

Figure 3C:
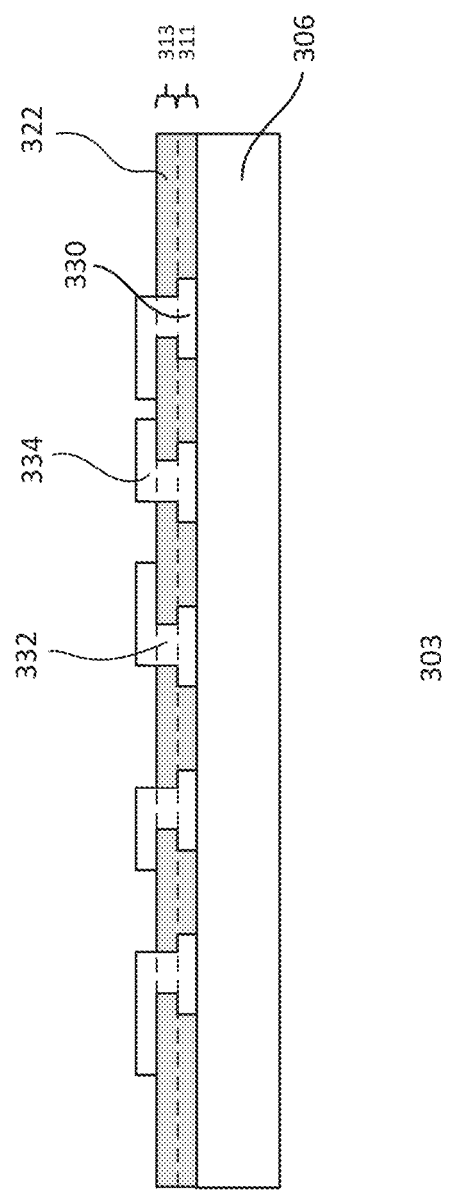

The process of building up the package substrate continues in FIG. 3c as shown. The proceeding steps are similar to the steps as described in FIG. 3a. Similar elements may not be described or described in detail.

Referring to FIG. 3c, in one embodiment, a second layer of conductive material 334 is printed onto the exposed top surface of the first layer of conductive material or terminal pads and over portions of the first layer of insulating material. As shown, the disposal or printing of the second layer of conductive material completely covers all exposed top surfaces of the first layer of conductive material, filling the gaps in-between the first layer of insulating material. This provides electrical connection for transmission of electrical signals between adjacent conductive traces of the interconnect structures. Further, the disposal or printing of the second layer of conductive material also covers a top portion of the first layer of insulating material, leaving the remaining top portion exposed for building of a next insulating layer with a next layer of insulating material to form the electrical isolation required in the interconnect structures.

In one embodiment, for example, the second layer of conductive material is also printed or dispensed according to design requirements and patterns. Other deposition techniques for the layer of conductive material may also be useful. Further, a lower or first via level 313 is also formed. For example, the lower via level has a plurality of via contacts 332 which serve to connect the lowermost line level to an intermediate line level.

The conductive material, in one embodiment, may be Cu, Au, Ag, solder material, alloys or a combination thereof. Providing any other conductive materials may also be useful. For example, the second layer of conductive material may include conductive material that is different to the conductive material used for the first layer of conductive material.

Figure 3D:
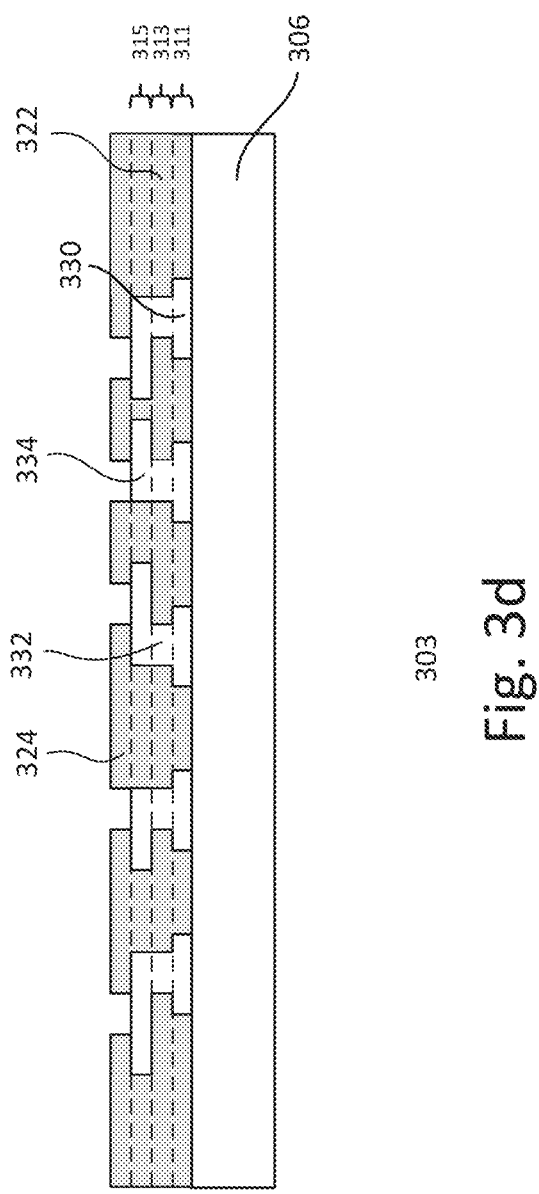

The process of building up the package substrate continues in FIG. 3d as shown. The proceeding steps are similar to the steps as described in FIG. 3b. Similar elements may not be described or described in detail.

Referring to FIG. 3d, in one embodiment, a second layer of insulating material 324 is printed onto the exposed top surface of the first layer of insulating material and over portions of the second layer of conductive material conductive traces. As shown, the disposal or printing of the second layer of insulating material completely covers all exposed top surfaces of the first layer of insulating material, filling the gaps in-between the second layer of conductive material or intermediate conductive traces. This provides electrical isolation and serves to prevent signal interference between adjacent conductive traces of the interconnect structures. Other deposition techniques for the second layer of insulating material may also be useful. In addition, the second layer of conductive material is also printed or dispensed according to design requirements and patterns.

In one embodiment, the disposal or printing of the second layer of insulating material also covers top portions of the second layer of conductive material or intermediate conductive traces, leaving the remaining top portions exposed for building of the via connections with next layer of conductive material to form the interconnect structures. In one embodiment, an intermediate line level 315 is also formed.

The second layer of insulating material may include dielectric materials. In one embodiment, the second layer of insulating material is a dielectric layer. The second layer of insulating material, for example, includes polymer materials which are not internally reinforced, such as but not limited to polyimide. Other suitable dielectric materials, such as solder mask, inorganic insulating film, epoxy resin or dielectric composites, may also be useful. For example, the second layer of insulating material may include insulating material that is different to the insulating material used for the first layer of insulating material.

Figure 3E:
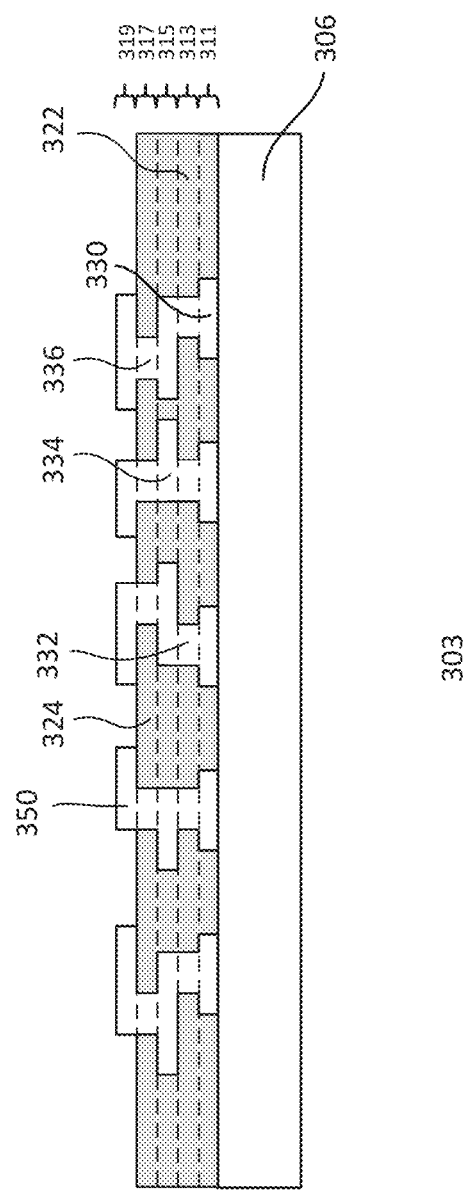

The process of building up the package substrate continues in FIG. 3e as shown. The proceeding steps are similar to the steps as described in FIG. 3a and FIG. 3c. Similar elements may not be described or described in detail.

Referring to FIG. 3e, in one embodiment, a third layer of conductive material 350 is printed onto the exposed top surface of the second layer of conductive material or intermediate conductive traces and over portions of the second layer of insulating material. As shown, the printing or disposal of the third layer of conductive material completely covers all exposed top surfaces of the intermediate conductive traces, filling the gaps in-between the second layer of insulating material. This provides electrical connection for transmission of electrical signals between adjacent conductive traces of the interconnect structures. Further, the disposal or printing of the third layer of conductive material also covers top portions of the second layer of insulating material, leaving the remaining top portions exposed for building of additional insulating and conductive layers to complete the building up of the package substrate according to design requirements.

In one embodiment, for example, the third layer of conductive material is also printed or dispensed according to design requirements and patterns. Other deposition techniques for the third layer of conductive material may also be useful. Deposition of the third layer of conductive material forms an upper or second via level 317. For example, the upper via level has a plurality of via contacts 336 serve to connect the intermediate line level to an uppermost line level 319.

The conductive material, in one embodiment, may be Cu, Au, Ag, solder material, alloys or a combination thereof. Providing any other conductive materials may also be useful. For example, the third layer of conductive material may include conductive material that is different to the conductive material used for the first layer of conductive material.

FIGS. 4a-4d show cross-sectional views of an embodiment of a process for forming a semiconductor package. The semiconductor package may be a same as that described in FIGS. 1, 2 and 3a-3e. In the interest of brevity, common elements may not be described or described in detail.

Figure 4A:
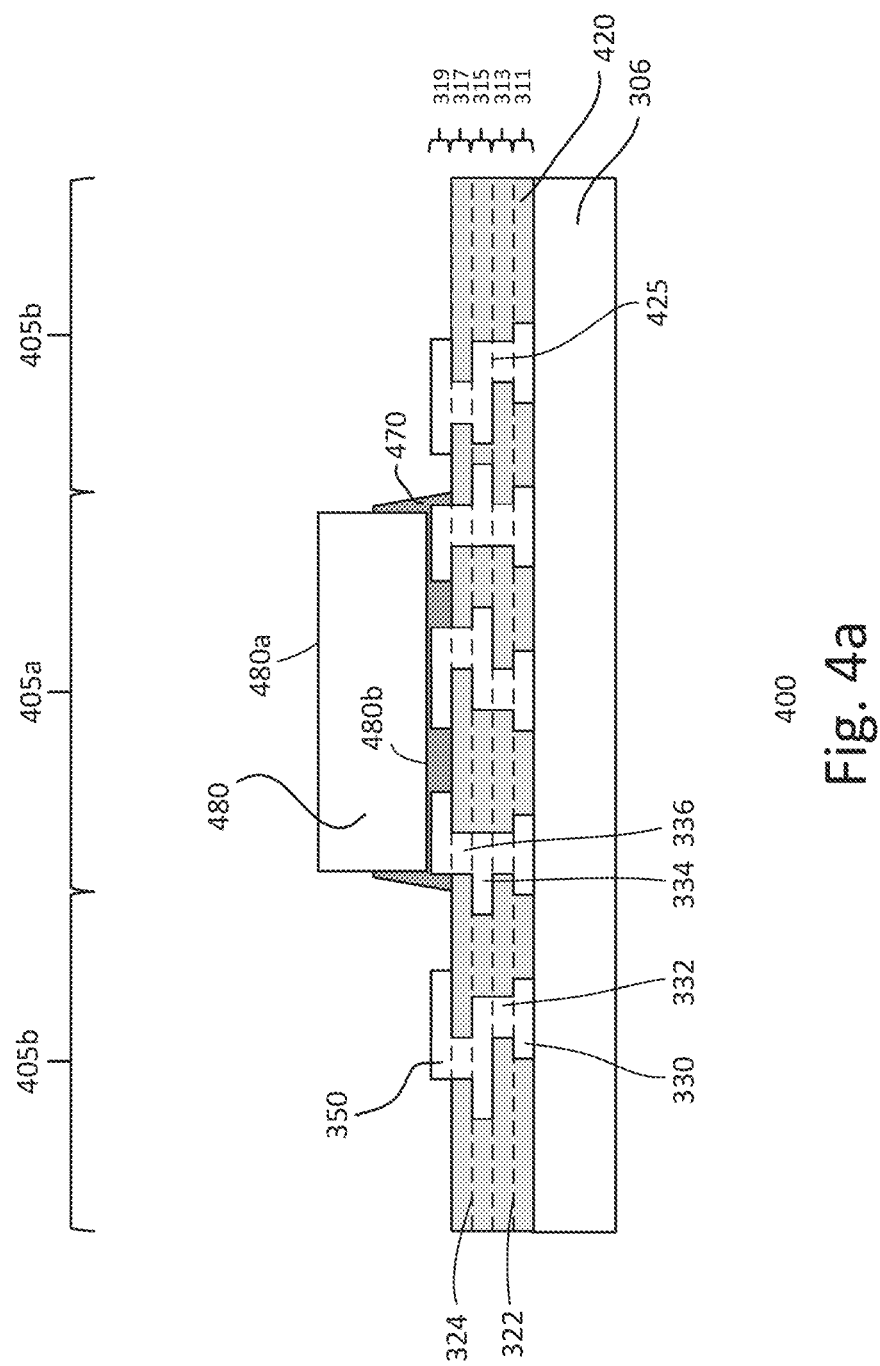

Referring to FIG. 4a, a package substrate is provided. The package substrate may be formed by processes same or similar to that described in FIGS. 3a-3e. For example, a plurality of conductive materials and insulating materials are built up by a printing process to form a plurality of metal line levels and via levels in alternating arrangement or pattern on a base carrier 406. For example, the top surface of the multi-layer buildup package substrate may be defined with a plurality of semiconductor die region or chip mounting region 405a and non-die region 405b. The semiconductor die region, for example, may be concentrically disposed within the periphery of the package substrate. Other configurations of the semiconductor die and non-die regions may also be useful.

As shown, the conductive materials in the line and via levels contribute to the electrical connections from the bottom to the top of the package substrate. This form interconnect structures 425 within the package substrate surrounded by buildup insulating materials 420 that serves to provide electrical isolation and prevention of signal interference between adjacent conductive traces and contacts of the interconnect structures. In one embodiment, terminal pads 330 are situated in the lowermost line level and serve to connect to package contacts. Bond pads 350 are situated in the uppermost line level and serve to connect to the semiconductor die via bond wires.

As shown, the die region 405a for which a semiconductor die or chip 480 is disposed on is positioned concentrically on the first major or top surface of the multi-layer buildup package substrate. The semiconductor die has an active top surface 480a and an inactive bottom surface 480b. In one embodiment, the bottom inactive surface of the semiconductor die is facing the first major or top surface of the package substrate, with a die attach layer 470 disposed in-between the two surfaces. The die attach layer surrounds the bottom and a portion of sides of the semiconductor die. The die attach layer serves as an adhesion material to bind and fix the semiconductor die in position on the top surface of the package substrate while maintaining electrical isolation between the semiconductor die and bond pads and other conductive traces or contacts. The die attach, for example, may be solder. Providing any other insulating adhesive materials may also be useful.

Referring to FIG. 4b, the process continues for fabricating the IC package. In one embodiment, a plurality of wire bonds 482 are disposed over the semiconductor die and package substrate to couple the two components. For example, the wire bonds are connected to the semiconductor die pads and the package substrate bond pads. The wire bonds serve to establish electrical connection between the semiconductor die and the interconnect structures or leadless leadframe of the package substrate. This establishment of electrical connectivity is important as it ultimately connects to external devices which requires the circuitry system of the IC package. The wire bond, for example, may be made of conductive materials such as Cu, Au, Ag, solder material, alloys or a combination thereof. Any other conductive materials for the wire bonds may also be useful.

Figure 4C:
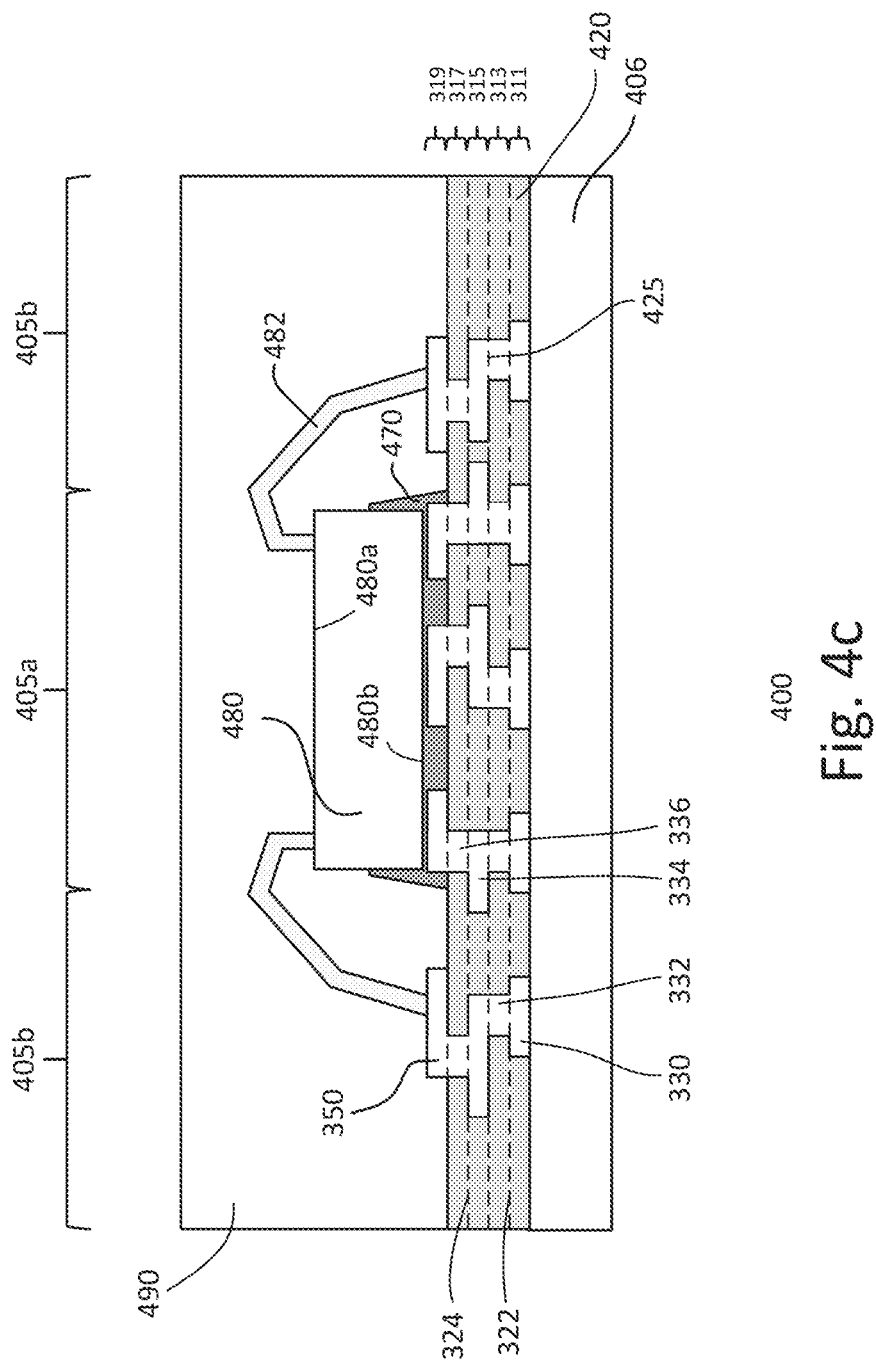

Referring to FIG. 4c, the process continues for the fabrication of the IC package. In one embodiment, an encapsulation cap 490 is disposed over the package substrate, encapsulating the semiconductor die, wire bonds and exposed top surfaces of bond pads and insulator layers. The encapsulation cap, for example, may be a dielectric layer. The encapsulation cap serves to provide insulation and isolation to the exposed package substrate components to protect them from electrical interferences and physical damages. Any other insulating or dielectric materials for the encapsulation cap may also be useful.

Figure 4D:
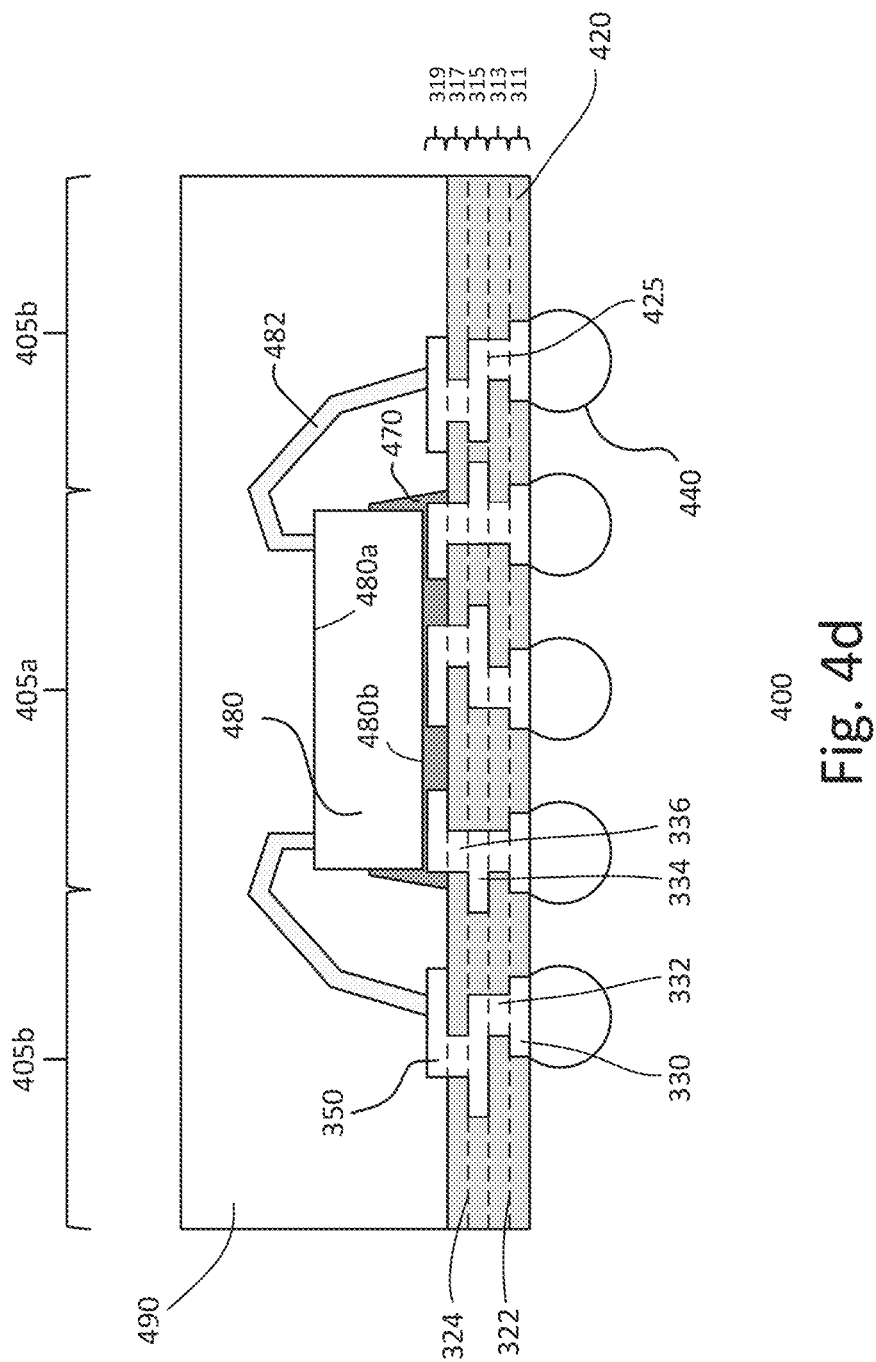

Referring to FIG. 4d, the process continues to complete the fabrication of the IC package. In one embodiment, the base carrier is completely removed to expose the terminal pads of the package substrate. For example, the carrier base may be etched away by wet etching or removed by performing chemical mechanical planarization (CMP). The exposed portions of the bottom conductive traces may serve as contact pads for package contacts 440. For example, the package contacts are mounted at the bottom surface of the package substrate at the exposed surface of the terminal pads.

Package contacts provide the package substrate with electrical connection points to the exterior of the QFN package through interconnect structures disposed in the package substrate. For example, interconnect structures within the package substrate electrically couple the semiconductor die to an external device (not shown). The external device in one embodiment, for example, is a PCB. The package contacts are formed of a conductive material, such as solder. Various types of solder can be used to form the package contacts. For example, the solder can be a non-lead based solder. Other suitable types of conductive materials may also be used to form the package contacts.

In one embodiment, the configurations of package contacts may include a full array configuration filling concentrically at the base of the QFN grid array package as shown by the bottom plan view 200a of the bottom of the semiconductor package in FIG. 2. Alternatively, the configurations of the package contacts may include lateral peripheral rows that only partially circumscribe the semiconductor die, such arrangements where lateral peripheral rows lie on opposing sides of the QFN grid array package. While it is desirable to have the package contacts positioned about each side of the QFN grid array package so as to maximize the number of package contacts and provide a dense I/O (input/output) connection area on the bottom surface of the package substrate, some designs may not require such an arrangement. Providing any other configurations and arrangements for the package contacts or conductive elements may also be useful.

The package contacts, in one embodiment, are spherical shaped structures or balls. The package contacts, for example, protrude from the bottom surface of the package substrate. Providing package contacts which do not protrude from the bottom surface of the package substrate, such as solder lands, may also be useful. Other structural forms of package contacts may also be useful. For example, the package contacts may be flat shape contacts or pads that are coplanar to the bottom surface of the package substrate. The flat shape contacts include, for example, any suitable geometrical shape such as square or rectangular shape.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor package comprising:
   forming a multi-layer buildup package substrate prepared with top and bottom surfaces, wherein the multi-layer buildup package substrate is built up and comprises interconnect structures, and wherein the top surface of the multi-layer buildup package substrate comprises a planar multi-layer buildup package substrate top surface, wherein the multi-layer buildup package substrate top surface comprises a die attach region with a semiconductor die disposed thereon and a non-die attach region being coplanar with the die attach region, the non-die attach region being outside the die attach region, bond pads being disposed in the non-die attach region, wherein forming the multi-layer buildup package substrate comprises:
   forming a lowermost line level over a base carrier, wherein forming the lowermost line level includes forming lowermost conductive elements which serve as terminal pads,
   forming a first via level over the lowermost line level, the first via level comprises first via contacts which serve as vertical connections of the interconnect structures,
   forming a plurality of intermediate line levels over the first via level, each of the plurality of intermediate line levels includes intermediate conductive elements and is separated by an intermediate via level which includes intermediate via contacts,
   forming a top via level over the plurality of intermediate line levels, the top via level comprises top via contacts, and
   forming an uppermost line level over the top via level, the uppermost line level includes uppermost conductive elements which serve as the bond pads;
   attaching a semiconductor die on the die attach region of the planar multi-layer buildup package substrate top surface, wherein the semiconductor die is connected to the interconnect structures;
   removing the base carrier to expose the terminal pads; and
   forming a plurality of bottom conductive elements on the bottom surface of the multilayer buildup package substrate, the plurality of bottom conductive elements are connected to the terminal pads and serve as package contacts, wherein the plurality of bottom conductive elements are connected to the interconnect structures of the multi-layer buildup package substrate.

2. The method of claim 1, wherein the semiconductor die comprises:
   semiconductor die pads on a top surface of the semiconductor die; and
   further comprises coupling the semiconductor die pads to the bond pads via wire bonds.

3. The method of claim 2, wherein forming the device further comprises:
   forming a dielectric layer over the top surface of the multi-layer buildup package substrate, the dielectric layer encapsulates the semiconductor die, the wire bonds and the top surface of the multi-layer buildup package substrate.

4. A method of forming a semiconductor package comprising:
   forming a multi-layer buildup package substrate prepared with top and bottom surfaces, wherein the multi-layer buildup package substrate is built up and comprises interconnect structures, and wherein the top surface of the multi-layer buildup package substrate comprises a planar multi-layer buildup package substrate top surface, wherein the multi-layer buildup package substrate top surface comprises a die attach region with a semiconductor die disposed thereon and a non-die attach region being coplanar with the die attach region, the non-die attach region being outside the die attach region, bond pads being disposed in the non-die attach region, wherein forming the multi-layer buildup package substrate comprises
   forming a lowermost line level over a base carrier, wherein forming the lowermost line level includes forming lowermost conductive elements which serve as terminal pads, forming a first via level over the lowermost line level, the first via level comprises first via contacts which serve as vertical connections of the interconnect structures, forming an intermediate line level over the first via level, wherein the intermediate line level includes intermediate conductive elements coupled to the first via contacts, forming a top via level over the intermediate line level, the top via level comprises top via contacts, and forming an uppermost line level over the top via level, the uppermost line level includes uppermost conductive elements which serve as the bond pads;

attaching a semiconductor die on the die attach region of the planar multi-layer buildup package substrate top surface, wherein the semiconductor die is connected to the interconnect structures;

removing the base carrier to expose the terminal pads; and forming a plurality of bottom conductive elements on the bottom surface of the multi-layer buildup package substrate, the plurality of bottom conductive elements are connected to the terminal pads and serve as package contacts, wherein the plurality of bottom conductive elements are connected to the interconnect structures of the multi-layer buildup package substrate.

5. The method of claim 4, wherein the semiconductor die comprises:

semiconductor die pads on a top surface of the semiconductor die; and further comprises coupling the semiconductor die pads to the bond pads via wire bonds.

6. The method of claim 5, wherein forming the device further comprises:

forming a dielectric layer over the top surface of the multi-layer build-up package substrate, the dielectric layer encapsulates the semiconductor die, the wire bonds and the top surface of the multi-layer buildup package substrate.

7. A method of forming a semiconductor package comprising:

forming a multi-layer buildup package substrate prepared with top and bottom surfaces, wherein the multi-layer buildup package substrate is built up, and wherein the top surface of the multi-layer buildup package substrate comprises a planar multi-layer buildup package substrate top surface, wherein the multi-layer buildup package substrate top surface comprises a die attach region with a semiconductor die disposed thereon and a non-die attach region being coplanar with the die attach region, the non-die attach region being outside the die attach region, bond pads being disposed in the non-die attach region, wherein the multi-layer build up package comprises a lowermost line level over a base carrier, the lowermost line level includes forming lowermost conductive elements, wherein the lowermost conductive elements serve as terminal pads, an intermediate line level over the lowermost line level, the intermediate line level includes intermediate conductive elements, and an uppermost line level over the intermediate line level, the uppermost line level includes uppermost conductive elements, wherein the uppermost conductive elements serve as the bond pads, and where each line level is separated by a via level which includes via contacts, the via contacts couple the lowermost, intermediate and uppermost conductive elements to form interconnect structures;

attaching a semiconductor die on the die attach region of the planar multi-layer buildup package top surface, wherein the semiconductor die is connected to the interconnect structures;

removing the base carrier to expose the terminal pads; and forming a plurality of bottom conductive elements connected to the terminal pads, the plurality of bottom conductive elements serve as package contacts.

8. The method of claim 7, wherein the semiconductor die comprises:

semiconductor die pads on a top die surface; and further comprises coupling the semiconductor die pads to the bond pads via wire bonds.

9. A method of forming a semiconductor package comprising:

providing a base carrier;

performing a printing process to form a package substrate, wherein forming the package substrate comprises printing a first discontinuous conductive layer directly on a top surface of the base carrier, the first discontinuous conductive layer comprising a conductive material separated by gaps which expose portions of the top surface of the base carrier, wherein the conductive material of the first discontinuous conductive layer forms terminal pads of the package substrate, printing a first discontinuous dielectric layer on the base carrier, wherein the first discontinuous dielectric layer fills the gaps in the first discontinuous conductive layer and partially covers a top surface of the terminal pads, the first discontinuous dielectric layer comprising gaps which expose a portion of the top surface of the terminal pads, printing a second discontinuous conductive layer, the second discontinuous conductive layer comprising a conductive material which fills the gaps in the first discontinuous dielectric layer and partially covers a top surface of the first discontinuous dielectric layer, wherein the second discontinuous conductive layer comprises gaps which expose portions of the top surface of the first discontinuous dielectric layer, printing a last discontinuous dielectric layer to form a top surface of the package substrate, and printing a last discontinuous conductive layer, the last discontinuous conductive layer filling gaps in the last discontinuous dielectric layer, and wherein the top surface of the package substrate comprises a planar package substrate top surface, wherein the planar package substrate top surface comprises a die attach region with a semiconductor die disposed thereon and a non-die attach region being coplanar with the die attach region, the non-die attach region being outside the die attach region, bond pads being disposed in the non-die attach region; and attaching a semiconductor die on the die attach region of the planar package substrate top surface.

10. The method of claim 9 wherein the second discontinuous conductive layer forms via contacts disposed in the gaps in the first discontinuous dielectric layer and conductive traces disposed over and partially covering the top surface of the first discontinuous dielectric layer.

11. The method of claim 10 wherein the printing process is an ink-jet printing process.

* * * * *